(12) United States Patent
Fukuzono (10) Patent No.: US 8,004,096 B2
(45) Date of Patent: Aug. 23, 2011

(54) SEMICONDUCTOR DEVICE AND A MANUFACTURING METHOD THEREOF

(75) Inventor: Kenji Fukuzono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 11/488,640

(22) Filed: Jul. 19, 2006

(65) Prior Publication Data
US 2007/0194464 A1   Aug. 23, 2007

(30) Foreign Application Priority Data
Feb. 22, 2006   (JP) ................. 2006-045625

(51) Int. Cl.
*H01L 23/29* (2006.01)
(52) U.S. Cl. ........................ 257/791; 257/676
(58) Field of Classification Search ........... 257/E23.065, 257/676, 787, 788, 791
See application file for complete search history.

(56) References Cited

U.S. PATENT DOCUMENTS

| | | | | |
|---|---|---|---|---|
| 5,841,194 A * | 11/1998 | Tsukamoto | ............ | 257/729 |
| 6,020,221 A * | 2/2000 | Lim et al. | ............ | 438/125 |
| 6,214,640 B1 * | 4/2001 | Fosberry et al. | ............ | 438/106 |
| 6,489,557 B2 * | 12/2002 | Eskildsen et al. | ............ | 174/529 |
| 7,061,085 B2 * | 6/2006 | Moxham | ............ | 257/684 |
| 7,728,440 B2 | 6/2010 | Honda | | |
| 2004/0150118 A1 * | 8/2004 | Honda | ............ | 257/778 |
| 2005/0161816 A1 | 7/2005 | Kanda | | |
| 2010/0230797 A1 | 9/2010 | Honda | | |

FOREIGN PATENT DOCUMENTS

| | | |
|---|---|---|
| JP | 2000-133741 | 5/2000 |
| JP | 2004-260138 | 9/2004 |
| WO | 2004/086498 | 10/2004 |

OTHER PUBLICATIONS

Japanese Office Action mailed Oct. 12, 2010 in corresponding Japanese Patent Application 2006-045625.

* cited by examiner

*Primary Examiner* — Steven Loke
*Assistant Examiner* — Kimberly M Thomas
(74) *Attorney, Agent, or Firm* — Staas & Halsey LLP

(57) ABSTRACT

A semiconductor device and a manufacturing method of the device are disclosed. The semiconductor device includes a substrate that mounts a semiconductor element, a first stiffener, a reinforcement resin member, and a second stiffener for reinforcing the reinforcement resin member.

14 Claims, 6 Drawing Sheets

12 SUBSTRATE

SEMICONDUCTOR DEVICE AND A MANUFACTURING METHOD THEREOF

BACKGROUND OF THE INVENTION

1. Field of the Invention

The present invention generally relates to a semiconductor device and a manufacturing method thereof; and especially relates to a semiconductor device, the mechanical strength of which semiconductor device is raised by a stiffener, and a manufacturing method thereof.

2. Description of the Related Art

In recent years and continuing, a semiconductor device wherein a semiconductor chip is mounted on an insulation film is offered. Although this type of semiconductor device has an advantage, in view of such as minute wiring and low mounting profile, there is a problem in that warpage of the semiconductor device occurs after mounting because the insulation film serves as a substrate. For this reason, a stiffener (a member for reinforcement) is arranged on the substrate such that the rigidity of the substrate is enhanced and the warpage is reduced (Patent Reference 1).

Figure 1:
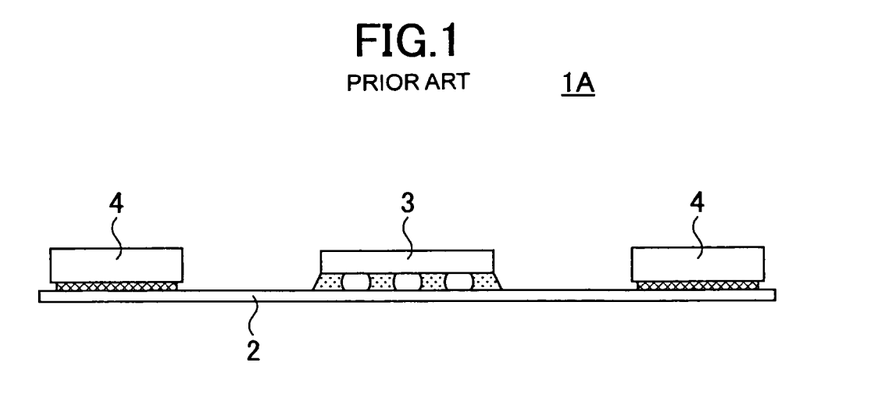
FIG. 1 is a cross-sectional view of the first conventional semiconductor device.

FIG. 1 shows a semiconductor device 1A (the first conventional semiconductor device). The semiconductor device 1A includes a substrate 2, a semiconductor element 3, and stiffeners 4. The substrate 2 is a thin substrate consisting of an insulation film, and the thickness is about 0.7 mm. A circuit pattern (not illustrated) is arranged on the substrate 2. The semiconductor element 3 is flip-chip bonded to a central part of the substrate 2. Although not illustrated, external connection terminals, such as solder balls, are prepared on the back side of the substrate 2 (the back side is the side opposite to the side where the semiconductor element 3 is mounted).

If the semiconductor element 3 is arranged at the central part of the substrate 2 without the stiffeners 4, a big warpage will occur in the substrate 2 when the semiconductor element 3 is flip-chip bonded, and when the semiconductor device 1A is mounted to an electronic instrument. For this reason, the stiffeners 4 are arranged in positions that surround the semiconductor element 3 on the substrate 2. The stiffeners 4 are made of metal material having rigidity greater than the substrate 2. By arranging the stiffeners 4 in this way, the substrate 2 is reinforced by the stiffeners 4, and the warpage is reduced.

Figure 2:
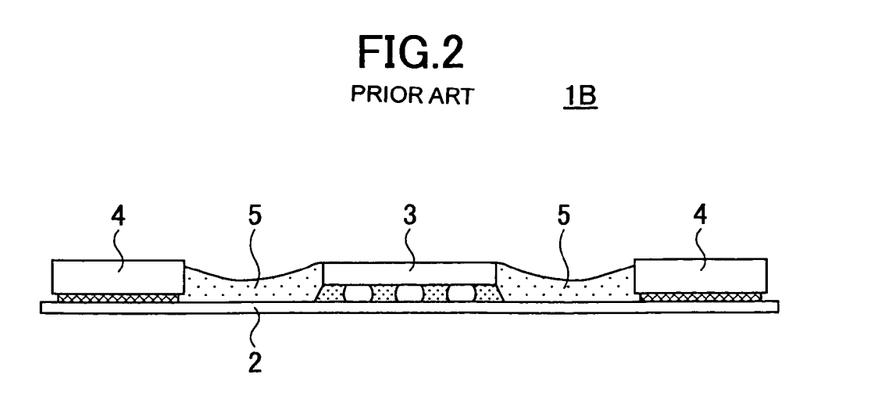
FIG. 2 is a cross-sectional view of the second conventional semiconductor device.

FIG. 2 shows a semiconductor device 1B (the second conventional semiconductor device) that includes reinforcement resin members 5 in addition to the stiffeners 4. According to the semiconductor device 1A as shown in FIG. 1, there are spaces between the semiconductor element 3 and the stiffeners 4. For this reason, there is a possibility that warpage may occur between the semiconductor element 3 and the stiffeners 4 on the substrate 2.

Then, according to the semiconductor device 1B shown in FIG. 2, the reinforcement resin members 5 are provided between the semiconductor element 3 and the stiffeners 4 for reinforcing the substrate 2. In this way, the magnitude of warpage of the semiconductor device 1B can be made smaller than the semiconductor device 1A shown in FIG. 1.

[Patent Reference 1] JPA 2000-133741

Problem(s) to be Solved by the Invention

After the semiconductor devices 1A and 1B are mounted on an electronic instrument, and the like, a cooling device is arranged on the upper surface of the semiconductor element 3. If warpage is present on the substrate 2 at this juncture, co-planarity of the semiconductor devices 1A and 1B is low; accordingly, there is a possibility that the cooling device cannot properly contact the semiconductor element 3, and the semiconductor element 3 cannot be properly cooled.

Further, the semiconductor devices 1A and 1B may not have sufficiently low profiles for a miniaturized electronic device such as a cellular phone, where even smaller and lower profiles are required.

Although warpage of the substrate 2 is reduced to an extent by providing the stiffeners 4 and the reinforcement resin members 5 with the conventional semiconductor devices 1A and 1B, the reduced warpage still poses a problem in that the substrate 2 cannot fully contact the cooling device or fully respond to small electronic device miniaturization.

SUMMARY OF THE INVENTION

The present invention may provide a semiconductor device and a manufacturing method thereof that substantially obviate one or more of the problems caused by the limitations and disadvantages of the related art.

Features of embodiments of the present invention are set forth in the description that follows, and in part will become apparent from the description and the accompanying drawings, or may be learned by practice of the invention according to the teachings provided in the description. Problem solutions provided by an embodiment of the present invention will be realized and attained by a semiconductor device and a manufacturing method thereof particularly pointed out in the specification in such full, clear, concise, and exact terms as to enable a person having ordinary skill in the art to practice the invention.

To achieve these solutions and in accordance with an aspect of the invention, as embodied and broadly described herein, an embodiment of the invention provides a semiconductor device and a manufacturing method thereof wherein warpage is satisfactorily reduced.

DESCRIPTION OF THE INVENTION

Means for Solving the Problem

According to an aspect of the present invention, the semiconductor device includes a substrate, a semiconductor element mounted on the surface of the substrate, a first stiffener arranged around the perimeter of the semiconductor element on the substrate, a reinforcement resin member provided between the first stiffener and the semiconductor element on the substrate, and a second stiffener for reinforcing the reinforcement resin member.

By providing the second stiffener, the reinforcement resin member is reinforced, and warpage of the substrate between the mounting position of the semiconductor element and the first stiffener is reduced.

According to an aspect of the present invention, the second stiffener is made of metal material.

According to an aspect of the present invention, the first stiffener and the second stiffener are structured such that the upper surface of the semiconductor element is exposed to the outside.

In this way, the upper surface of the semiconductor element can be effectively cooled.

According to an aspect of the present invention, the second stiffener is separated from the substrate.

In this way, the second stiffener can reinforce only the reinforcement resin member.

Further, an embodiment of the present invention includes a manufacturing method of the semiconductor device as described above, the manufacturing method including:

a process of bonding the first stiffener to the substrate;

a process of surface-mounting the semiconductor element on the substrate, to which the first stiffener has been bonded;

a process of forming the resin member for reinforcement between the semiconductor device and the first stiffener on the substrate; and a process of forming the second stiffener in the resin member for reinforcement, this process being included in the process of forming the resin member for reinforcement between the semiconductor element and the first stiffener on the substrate.

By forming the second stiffener in the process of forming the resin for reinforcement, the manufacturing process is not complicated even when the second stiffener is provided.

Effect of the Invention

According to the present invention, since the reinforcement resin member is reinforced by the second stiffener, warpage is prevented from occurring between the mounting position of the semiconductor element and the arrangement position of the first stiffener on the substrate.

DESCRIPTION OF THE PREFERRED EMBODIMENTS

In the following, embodiments of the present invention are described with reference to the accompanying drawings.

Figure 3:
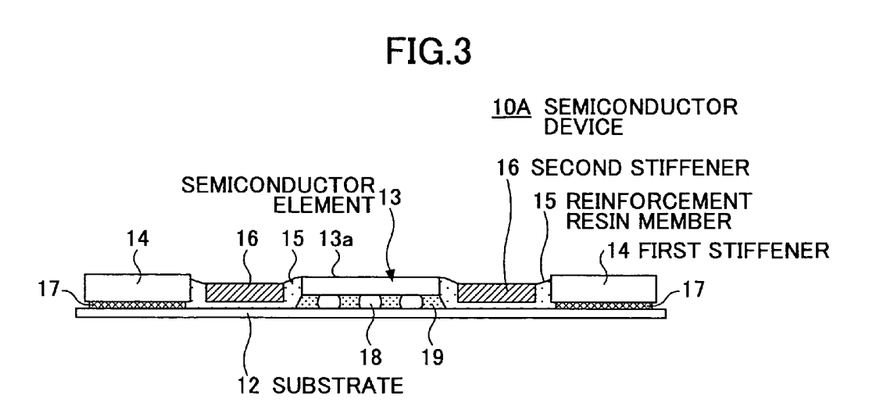
FIG. 3 is a cross-sectional view of the semiconductor device according to the embodiment of the present invention.
Figure 4:
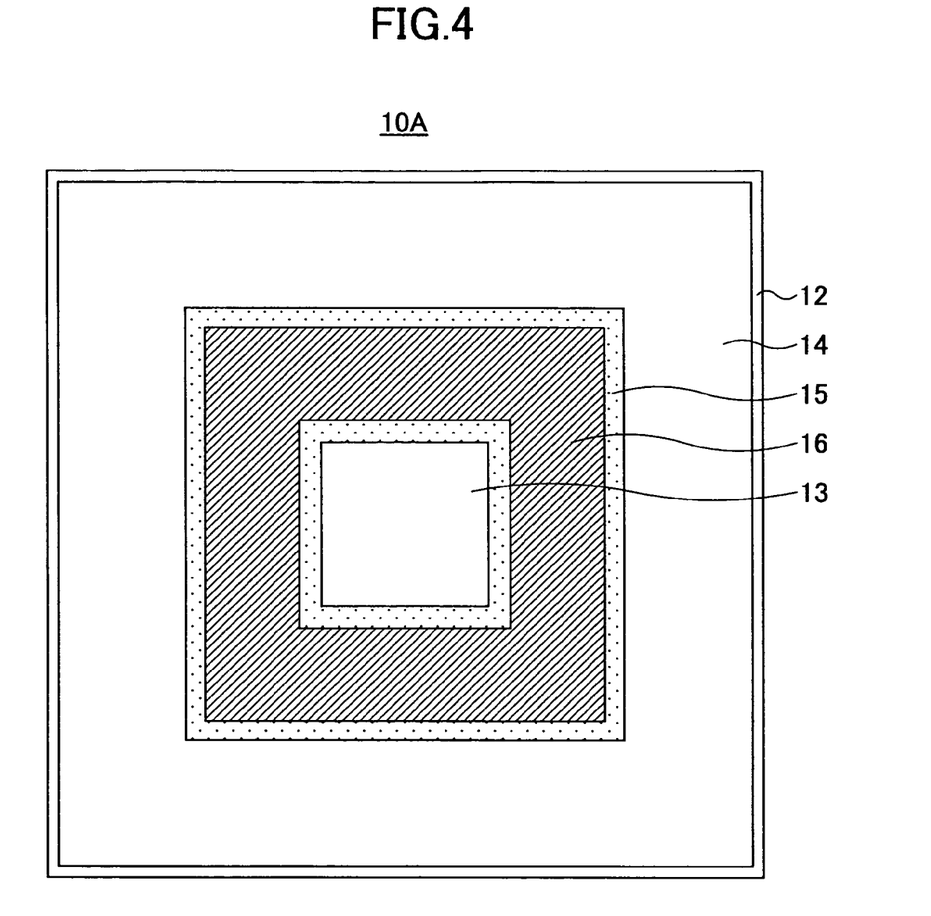
FIG. 4 is a plan view of the semiconductor device according to the embodiment of the present invention.

FIG. 3 is a cross-sectional view of a semiconductor device 10A according to the embodiment of the present invention, and FIG. 4 is a plan view of the semiconductor device 10A.

The semiconductor device 10A includes a substrate 12, a semiconductor element 13, a first stiffener 14, a reinforcement resin member 15, and a second stiffener 16.

The substrate 12 is made of insulating resin, such as polyimide. A circuit pattern (not illustrated) made of copper is formed on the substrate 12. The thickness of the substrate 12 is between 0.1 and 0.5 mm. That is, the substrate 12 is very thin compared with a printed-circuit board, and the like. With this thinness of the substrate 12, the semiconductor device 10A can be made thin (low profile) and the circuit pattern can be densely arranged.

The semiconductor element 13 is mounted at the center of the substrate 12. In this embodiment, the semiconductor element 13 is mounted on the substrate 12 using a flip chip bonding method, which is one of the surface mount methods. In this way, solder bumps 18 beforehand arranged on a circuit formation side of the semiconductor element 13 are connected to bonding pads (not illustrated) formed on the substrate 12. Further, underfill resin 19 is arranged between the semiconductor element 13 and the substrate 12 for protecting the solder bumps 18.

The first stiffener 14 is made of metal material, such as copper or stainless steel. The first stiffener 14 is shaped like a rectangular frame as shown in FIG. 4. Further, according to the embodiment, the outside length of the first stiffener 14 measures 45 mm, and the inside (opening) length measures 30 mm. The first stiffener 14 is fixed to the substrate 12 by an adhesive 17. In this way, warpage of the substrate 12 is reduced by the first stiffener 14. However, as described above, the first stiffener 14 alone cannot completely prevent the warpage in the substrate 12.

Then, the reinforcement resin member 15, which is made of thermosetting resin such as epoxy, is provided. The reinforcement resin member 15 is formed between the semiconductor element 13 and the first stiffener 14. In this way, warpage in a space between the semiconductor element 13 and the first stiffener 14 on the substrate 12 can be reduced. However, the combination of the first stiffener 14 and the reinforcement resin member 15 still cannot reduce the warpage in the substrate 12 to a desired level.

Then, the second stiffener 16 is provided, which is made of the same material as the first stiffener 14 according to the embodiment. That is, the second stiffener 16 is made of metal material, such as copper or stainless steel. However, the material of the second stiffener 16 does not have to be the same as the first stiffener 14, but may be a material according to the level of reinforcement needed for the reinforcement resin member 15.

Dimensions of the second stiffener 16 are determined such that the second stiffener 16 can be arranged in the space between the semiconductor element 13 and the first stiffener 14. According to the embodiment, the second stiffener 16 is shaped like a rectangular frame as shown in FIG. 4. The second stiffener 16 is arranged in the reinforcement resin member 15, and the bottom of the second stiffener 16 does not contact the substrate 12. Accordingly, the second stiffener 16 serves to reinforce only the reinforcement resin member 15 rather than directly reinforcing the substrate 12.

According to the semiconductor device 10A having the second stiffener 16 for reinforcing the reinforcement resin member 15, warpage between the mounting position of the semiconductor element 13 and the bonding position of the first stiffener 14 in the substrate 12 is prevented from occurring.

Figure 10:
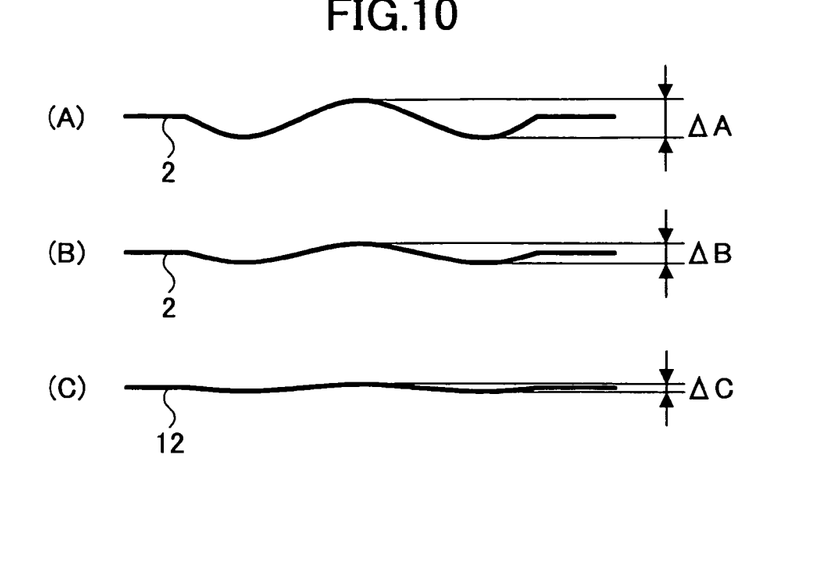
FIG. 10 gives graphs of the warpage generated in the first conventional semiconductor device, the second conventional semiconductor device, and the semiconductor device according to the embodiment of the present invention.

FIG. 10 gives warpage graphs of the substrates 2 and 12 where warpage is generated, showing experiment results obtained by the inventor hereof. Specifically, warpage in the first conventional semiconductor device 1A (FIG. 1) is shown at (A), warpage in the second conventional semiconductor device 1B (FIG. 2) is shown at (B), and warpage in the semiconductor device 10A (FIGS. 3 and 4, i.e., according to the embodiment) is shown at (C). Here, each result is obtained under the same conditions.

Here, the magnitude of the warpage is defined by the difference between a peak and a valley of the warpage in the corresponding substrates 2 and 12. Further, the magnitude in the first conventional semiconductor device 1A is called ΔA, the magnitude in the second conventional semiconductor device 1B is called ΔB, and the magnitude in the semiconductor device 10A is called ΔC. Then, ΔA was 306.4 μm and ΔB was 275.84 μm. On the other hand, ΔC was 149.4 μm. That is, the magnitude of the warpage in the semiconductor device 10A (the present embodiment) is reduced to nearly a half of that of the first conventional semiconductor device 1A.

As described above, the warpage is effectively reduced in the semiconductor device 10A of the embodiment wherein the second stiffener 16 is provided in the reinforcement resin member 15. Further, it becomes possible to firmly install a cooling device on the semiconductor device 10A, and to install the semiconductor device 10A in a small electronic instrument.

Further, according to the embodiment, an upper surface 13a of the semiconductor element 13 is exposed to the outside with both the first stiffener 14 and the second stiffener 16 being shaped like a rectangular frame. That is, cooling of the semiconductor element 13 is not disturbed by providing the first and second stiffeners 14 and 16, and the semiconductor element 13 can be easily cooled. Further, installing the cooling device on the upper surface 13a of the semiconductor element 13 is facilitated.

In addition, although the second stiffener 16 is shaped like a rectangular frame according to the embodiment, the shape of the second stiffener 16 does not have to be rectangular, nor like a frame. For example, the shape may be desirably determined so as only to fit (reinforce) a portion where stress is especially concentrated between the semiconductor element 13 and the first stiffener 14 where warpage tends to occur.

In addition, the degree of the reinforcement provided by the second stiffener 16 to the reinforcement resin member 15 changes with properties (rigidity, mechanical intensity, etc.) of the material and the form (rectangular form, annular form, etc.) of the second stiffener 16. Accordingly, the degree of reinforcement of the substrate 12 by the reinforcement resin member 15 (reinforced by the second stiffener 16) can be adjusted by selecting the material and the form of the second stiffener 16.

In the following, an embodiment of the manufacturing method of the semiconductor device 10A having the structure described above is described with reference to FIGS. 5 through 9.

Figure 5:
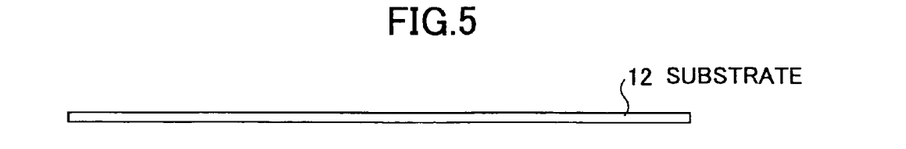
FIG. 5 is a cross-sectional view No. 1 of the semiconductor device for explaining the manufacturing method according to the embodiment of the present invention.

In order to manufacture the semiconductor device 10A, the substrate 12 is prepared (refer to FIG. 5). As described above, the substrate 12 is made of the resin film that includes polyimide, and a predetermined circuit pattern made of copper is formed on the substrate 12.

Figure 6:
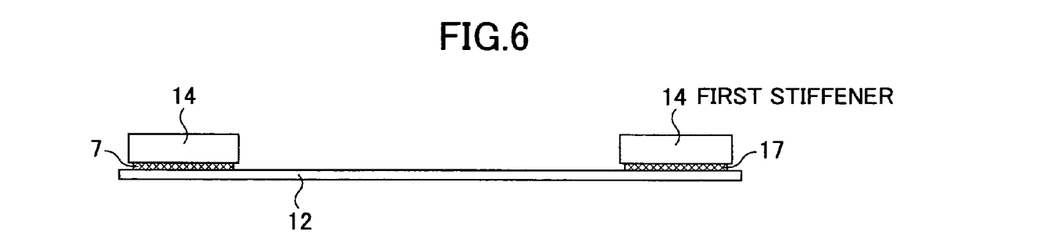
FIG. 6 is a cross-sectional view No. 2 of the semiconductor device for explaining the manufacturing method according to the embodiment of the present invention.
Figure 7:
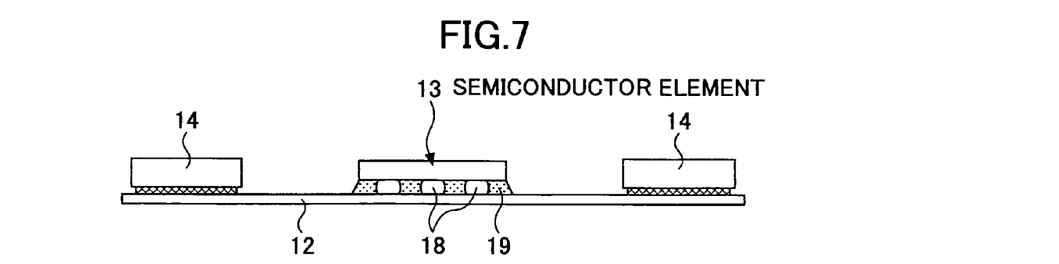
FIG. 7 is a cross-sectional view No. 3 of the semiconductor device for explaining the manufacturing method according to the embodiment of the present invention.

Next, the first stiffener 14 is arranged on the substrate 12 (refer to FIG. 6). The first stiffener 14 is made of metal material, such as copper or stainless steel, and is beforehand fabricated in the shape of a rectangular frame. This first stiffener 14 is fixed to the substrate 12 using the adhesive 17.

Next, the semiconductor element 13 is mounted on the substrate 12, where the first stiffener 14 has been arranged. Specifically, the solder bumps 18 are beforehand formed on the circuit formation side of the semiconductor element 13, and the solder bumps 18 are flip-chip bonded to the bonding pads (not illustrated) formed on the substrate 12. After the semiconductor element 13 is bonded to the substrate 2, the underfill resin 19 is formed between the semiconductor element 13 and the substrate 12 (refer to FIG. 7) for protecting the solder bumps 18. Here, although wire-bonding connection is possible instead of the flip-chip bonding, the flip chip bonding is more desirable from the viewpoint of miniaturization of the semiconductor device 10A.

Next, the reinforcement resin member 15 is arranged in the space between the semiconductor element 13 and the first stiffener 14 on the substrate 12. The reinforcement resin member 15 is, for example, an epoxy resin, and is dropped into the space by potting, and the like. The epoxy resin contains various fillers for raising intensity. Further, the epoxy resin is thermosetting, that is, a viscous liquid until it is thermally hardened; therefore, potting can be used.

Figure 8:
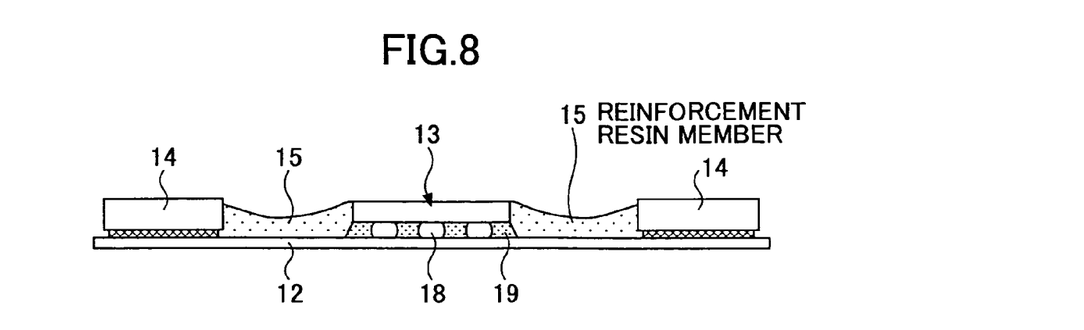
FIG. 8 is a cross-sectional view No. 4 of the semiconductor device for explaining the manufacturing method according to the embodiment of the present invention.
Figure 9:
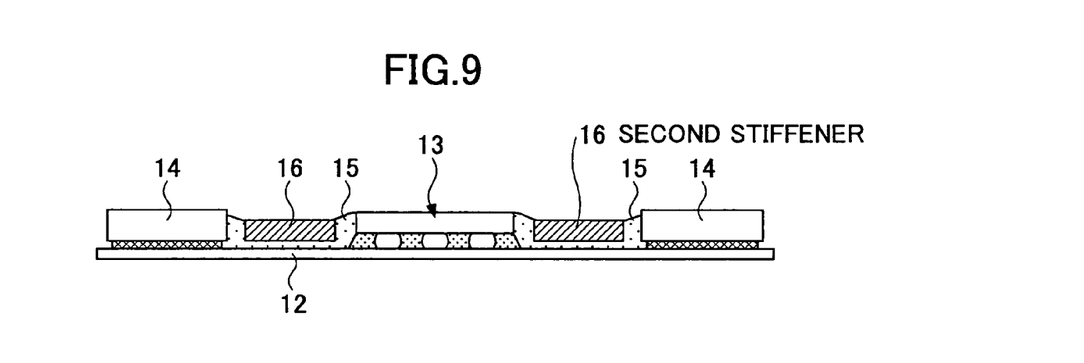
FIG. 9 is a cross-sectional view No. 5 of the semiconductor device for explaining the manufacturing method according to the embodiment of the present invention.

FIG. 8 shows the reinforcement resin member 15 is filling in between the semiconductor element 13 and the first stiffener 14 on the substrate 12. The reinforcement resin member 15 is not thermally hardened in FIG. 8, but is liquid. Next, the second stiffener 16 is inserted into the reinforcement resin member 15, which is in the liquid state (refer to FIG. 9). At this time, the second stiffener 16 is inserted into the reinforcement resin member 15 so that the second stiffener 16 may not contact the substrate 12, namely, so that the second stiffener 16 may be separated from the substrate 12.

When the second stiffener 16 is arranged in the reinforcement resin member 15, heat treatment is performed so that the reinforcement resin member 15 is thermally hardened, and the second stiffener 16 is fixed in the reinforcement resin member 15. Through the processes described above, the semiconductor device 10A as shown in FIG. 3 and FIG. 4 is manufactured.

According to the manufacturing method described above, the second stiffener 16 is provided without complicating the manufacturing process, since the second stiffener 16 is arranged in the resin 15 in the process of forming the reinforcement resin 15.

Figure 11:
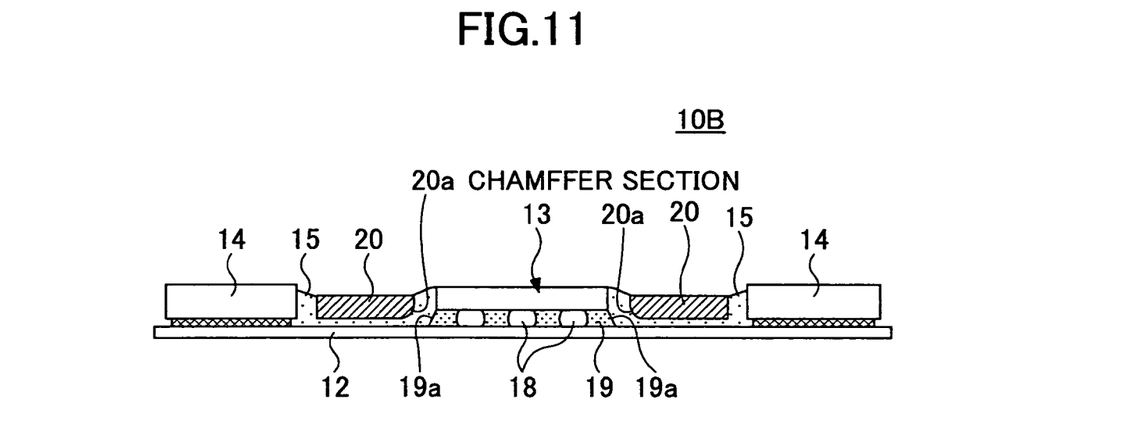
FIG. 11 is a cross-sectional view of a modification of the semiconductor device shown in FIG. 3 and FIG. 4.

FIG. 11 shows a semiconductor device 10B according to a modification of the embodiment. The semiconductor device 10B includes a second stiffener (instead of the second stiffener 16) in the reinforcement resin member 15, a corner of the second stiffener 20 being rounded by a chamfer section 20a.

When an angle section is present in the second stiffener that is inserted in the reinforcement resin member 15, there is a possibility that stress concentration may occur in the angle section, and a crack, and the like, may occur. However, by forming the chamfering section 20a on the second stiffener 20 as in this modification, stress concentration is prevented from occurring and the reliability of the semiconductor device 10B can be raised.

Further, the present invention is not limited to these embodiments, but variations and modifications may be made without departing from the scope of the present invention.

The present application is based on Japanese Priority Application No. 2006-045625 filed on Feb. 22, 2006 with the Japanese Patent Office, the entire contents of which are hereby incorporated by reference.

What is claimed is:

1. A semiconductor device comprising:
   a substrate;
   a semiconductor element that is surface-mounted on the substrate;
   a first stiffener arranged in a position surrounding the semiconductor element on the substrate;
   a reinforcement member extending between and in contact with the semiconductor element and the first stiffener on the substrate; and
   a second stiffener reinforcing the reinforcement member, wherein the second stiffener is arranged into the reinforcement member between the semiconductor element and the first stiffener such that a bottom surface of the second stiffener is not in contact with the substrate, and a top surface of the second stiffener is lower than at least one of a top surface of the semiconductor element and a top surface of the first stiffener.

2. The semiconductor device as claimed in claim 1, wherein the second stiffener is made of metal material.

3. The semiconductor device as claimed in claim 2, wherein the second stiffener is made of one of copper and stainless steel.

4. The semiconductor device as claimed in claim 1, wherein the first stiffener and the second stiffener are structured such that an upper surface of the semiconductor element is exposed to outside.

5. The semiconductor device as claimed in claim 1, wherein a thickness of the substrate is between 0.1 mm and 0.5 mm.

6. The semiconductor device as claimed in claim 1, wherein the second stiffener is arranged separated from the substrate.

7. A manufacturing method of a semiconductor device, comprising:
bonding a first stiffener on a substrate;
surface-mounting a semiconductor element on the substrate, to which substrate the first stiffener has been bonded; and
forming a reinforcement member extended between and in contact with the semiconductor element and the first stiffener on the substrate, and a second stiffener into the reinforcement member for reinforcement of the reinforcement member between the semiconductor element and the first stiffener on the substrate, wherein a top surface of the second stiffener is lower than at least one of a top surface of the semiconductor element and a top surface of the first stiffener.

8. The manufacturing method of the semiconductor device as claimed in claim 7, wherein the reinforcement member is made of resin which is hardened after the second stiffener is arranged in the resin for reinforcement.

9. A semiconductor device in which a semiconductor element formed on a substrate is protected by a first stiffener that surrounds the semiconductor element, and by a resin disposed between the semiconductor element and the first stiffener, comprising:
a second stiffener dipped in an upper part of the resin between the semiconductor element and the first stiffener while the resin is in a liquid state.

10. The semiconductor device of claim 9, wherein the second stiffener is not in contact with any of the substrate, the first stiffener and the semiconductor element.

11. The semiconductor device as claimed in claim 1, wherein the reinforcement member is made of resin.

12. The manufacturing method of the semiconductor device as claimed in claim 7, wherein the reinforcement member is made of resin.

13. A semiconductor device as claimed in claim 1, wherein the second stiffener has a corner portion opposing the semiconductor element, which is rounded.

14. The manufacturing method of the semiconductor device as claimed in claim 7, further comprising rounding a corner portion of the second stiffener which opposes the semiconductor element.

* * * * *

UNITED STATES PATENT AND TRADEMARK OFFICE
CERTIFICATE OF CORRECTION

| | | |
|---|---|---|
| PATENT NO. | : 8,004,096 B2 | Page 1 of 1 |
| APPLICATION NO. | : 11/488640 | |
| DATED | : August 23, 2011 | |
| INVENTOR(S) | : Kenjo Fukuzono | |

It is certified that error appears in the above-identified patent and that said Letters Patent is hereby corrected as shown below:

Column 8, Line 16, in claim 9, delete "state." and insert -- state and wherein a top surface of the second stiffener is lower than at least one of a top surface of the semiconductor element and a top surface of the first stiffener. --, therefor.

Signed and Sealed this
Seventh Day of February, 2012

David J. Kappos
*Director of the United States Patent and Trademark Office*